United States Patent [19]

Frerichs

[11] Patent Number: 5,646,438
[45] Date of Patent: Jul. 8, 1997

[54] PROGRAMMABLE SEMICONDUCTOR MEMORY

[75] Inventor: Heinz-Peter Frerichs, St. Peter, Germany

[73] Assignee: Deutsche ITT Industries GmbH, Freiburg, Germany

[21] Appl. No.: 555,910

[22] Filed: Nov. 13, 1995

[30] Foreign Application Priority Data

Dec. 11, 1994 [DE] Germany ............ 44 40 539.1

[51] Int. Cl.$^6$ .................................. H01L 29/04
[52] U.S. Cl. ................. 257/530; 257/50; 257/379; 257/529; 365/96; 365/225.7
[58] Field of Search ................. 257/50, 379, 529, 257/530

[56] References Cited

U.S. PATENT DOCUMENTS

| | | | |
|---|---|---|---|
| 4,757,359 | 7/1988 | Chiao et al. | 257/37 |
| 5,172,199 | 12/1992 | Yamauchi et al. | 365/185.04 |
| 5,208,177 | 5/1993 | Lee | 437/47 |
| 5,246,873 | 9/1993 | Matsuo et al. | 437/52 |
| 5,266,829 | 11/1993 | Hamdy et al. | 257/530 |
| 5,282,158 | 1/1994 | Lee | 365/96 |
| 5,299,151 | 3/1994 | Ishihara et al. | 365/96 |
| 5,311,039 | 5/1994 | Kimura et al. | 257/50 |
| 5,327,024 | 7/1994 | Cox | 326/38 |

FOREIGN PATENT DOCUMENTS

WO9220095 11/1992 WIPO.

*Primary Examiner*—Ngân V. Ngô
*Assistant Examiner*—Allan R. Wilson
*Attorney, Agent, or Firm*—Plevy & Associates

[57] ABSTRACT

A programmable semiconductor memory is disclosed which can be fabricated with an MOS process of low complexity and which takes up little space. The memory comprises a MOS field-effect transistor having an antifuse region between the gate electrode and the drain region. Prior to application of a programming voltage, the antifuse region electrically isolates the gate electrode and the drain region from each other. On application of the programming voltage to the gate electrode, which is greater than the supply voltage applied between the drain and the source, the antifuse region changes to a low-impedance state.

20 Claims, 2 Drawing Sheets

PROGRAMMABLE SEMICONDUCTOR MEMORY

FIELD OF THE INVENTION

The present invention generally relates to semiconductor circuits and more particularly, to a programmable semiconductor memory.

BACKGROUND OF THE INVENTION

As semiconductor circuits become more complex, increasingly stringent requirements are placed on their flexibility. It is, therefore, necessary to provide such semiconductor circuits with programmable memories that can be programmed after manufacture of the integrated circuit (IC). Erasable programmable read-only memories (EPROMs) can be used for this purpose. Programmable circuit structures with programmable elements, such as EPROMs or gate regions, are well known in the art. One such programmable circuit is disclosed in WO 92/20095. This reference describes programmable elements which include an antifuse region. The antifuse region is made of a material which is not electrically conductive in a first state, the unprogrammed or high-impedance state, but which is made conductive in a second state, the programmed or low-impedance state, by applying a sufficiently high voltage thereto. The antifuse region described in WO 92/20095 is used to short-circuit two conductors by applying an external voltage.

There are, however, some disadvantages associated with the use of EPROMs, such as the one described in WO 92/20095. One such disadvantage is that EPROMs are relatively complicated and costly to fabricate. Another disadvantage is that EPROM circuits take up relatively more space than other types of semiconductor circuits.

It is, therefore, the object of the present invention to provide a programmable semiconductor memory which can be fabricated with an MOS process of low complexity and takes up less space than prior art programmable semiconductor memories.

SUMMARY OF THE INVENTION

A programmable semiconductor memory comprising an MOS field-effect transistor including a gate electrode, a drain region, and an antifuse region disposed between the gate electrode and the drain region. The antifuse region isolates the gate electrode and the drain region from each other prior to application of a programming voltage and changes to a low-impedance state on application of the programming voltage, which is greater than the supply voltage. Thus, the antifuse region provides a conductive path between the gate electrode and the drain region.

BRIEF DESCRIPTION OF THE FIGURES

The present invention will now be described in more detail with reference to the accompanying drawings, in which.

DETAILED DESCRIPTION OF THE INVENTION

Figure 1:
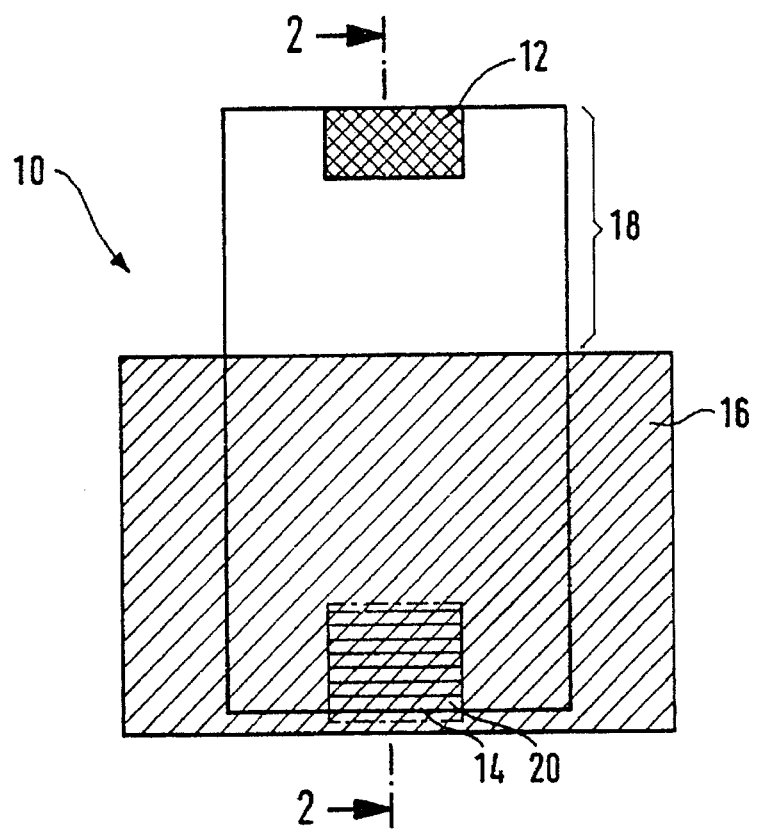
FIG. 1 is a plan view of a semiconductor memory according to the present invention.

A programmable semiconductor memory according to the present invention will now be described with reference to FIGS. 1 and 2. The programmable semiconductor memory of the present invention generally comprises a metal oxide semiconductor field-effect transistor (MOSFET) 10 which forms the basic cell of the semiconductor memory. The transistor 10 includes a source region 12, a drain region 14, and a gate electrode 16. In the embodiment shown, the transistor 10 is an n-channel transistor wherein the source region 12 and drain region 14 are doped n-type. The transistor 10 is provided on a substrate 18 which is doped p-type. However, it should be understood that the present invention can also be embodied in a p-channel transistor.

In any case, an antifuse region 20 is disposed between the drain region 14 and the gate electrode 16. Adjacent to the antifuse region 20 is a gate oxide 22 that extends between the gate electrode 16 and the substrate 18.

The antifuse region 20 enables the transistor 10 to be programmable. Further, locating the antifuse region 20 between the gate electrode 16 and the drain region 14 results in a space-saving structure. The antifuse region 20 is preferably fabricated from silicon dioxide or any other suitable material which exhibits a high impedance prior to the application of a programming voltage greater than the supply voltage. The high impedance state of the antifuse region 20 isolates the drain region from the gate electrode. On application of the programming voltage via the drain region 14 and the gate electrode 16, the antifuse region 20 changes to a low-impedance state and thus, provides a low-resistivity conductive path between the drain region 14 and the gate electrode 16. Accordingly, the transistor 10 can be programmed by applying the programming voltage, so that the transistor 10 forms a semiconductor memory. A read voltage can be applied to the transistor 10 to determine whether the transistor 10 was programmed or not. If the transistor was programmed, a conductive path will exist between the drain region 14 and the gate electrode 16 via the low-impedance state of the antifuse region 20. More specifically, on application of the read voltage, a current will flow through the transistor 10, which can be detected. If the transistor was not programmed, the drain region 14 will be isolated from the gate electrode 16 and thus, on application of the read voltage, no current will flow through the transistor 10.

The antifuse region 20 is formed with the use of only one additional mask in a conventional MOS process. This substantially reduces the complexity and cost of the memory fabrication process. Hence, the cost of fabricating the programmable semiconductor memory of the present invention is relatively low when compared to prior art EPROMs.

As stated earlier, the antifuse region 20 is preferably made of silicon dioxide. In using this material, the breakdown strength of the antifuse region 20 can be set within certain limits by suitable implantation into the region underlying the antifuse region 20, herein the drain region 14. In particular, the higher the doping level of the drain region 14, the lower the breakdown strength of the antifuse region 20. Further, if the antifuse region 20 covers the drain region 14, the dielectric breakdown strength can be set evenly throughout the antifuse region 20 by means of the doping level of the drain region 14.

A further measure of the dielectric breakdown strength of the antifuse region 20 is represented by the thickness $T_{af}$ of this region. The thickness $T_{af}$ of the antifuse region 20 is less than the thickness $T_g$ of the gate oxide 22. This enables the gate oxide 22 to be of the same material as the antifuse region 20, e.g., silicon dioxide. The thicker gate oxide region 22 is created by depositing more material outside the area of the antifuse region 20. By applying the programming voltage to the drain region 14 and the gate electrode 16, dielectric breakdown can be limited to the antifuse region 20, while simultaneously ensuring that the gate oxide 22 does not break down and remains in its insulating state by virtue of its greater thickness. The breakdown strength, and thus, the required programming voltage, increases with increasing thickness of the antifuse region 20.

Memory function can be achieved in the transistor 10 of the present invention by setting the predetermined breakdown strength of the antifuse region 20 with the doping level of the drain region 14. Preferably, the doping level of the drain region 14 is lower than that of the source region 12. The doping levels may typically differ by a factor of 10. This prevents the gate oxide 22 from breaking down due to the high doping level of the source region 12 when the programming voltage is applied. A typical implant dose from the drain region 14 in a silicon substrate would be, for example, $(2-10) \times 10^{14}$ A/cm$^2$, with arsenic used as a dopant. The exact value is also dependent on the implant energy of the respective dopant. In the preferred embodiment where silicon dioxide is used for the antifuse region 20, the thickness $T_{af}$ of the antifuse region 20, should be 8 to 12 nm. The preferred arsenic implant dose of the drain region 14 would then be $10^{14}$ A/cm$^2$, and the preferred programming voltage would be between 10 and 12 volts at a current of 1μ. It should be understood, however, that memory function can be achieved in the transistor of the present invention with other combinations of the above listed parameters. As a rule, the doping level of the drain region 14 should be one order of magnitude lower than that of the source region 12. This will prevent any undesired dielectric breakdown of the thin antifuse region 20 caused by too high a doping level of the drain region 14.

Figure 3:
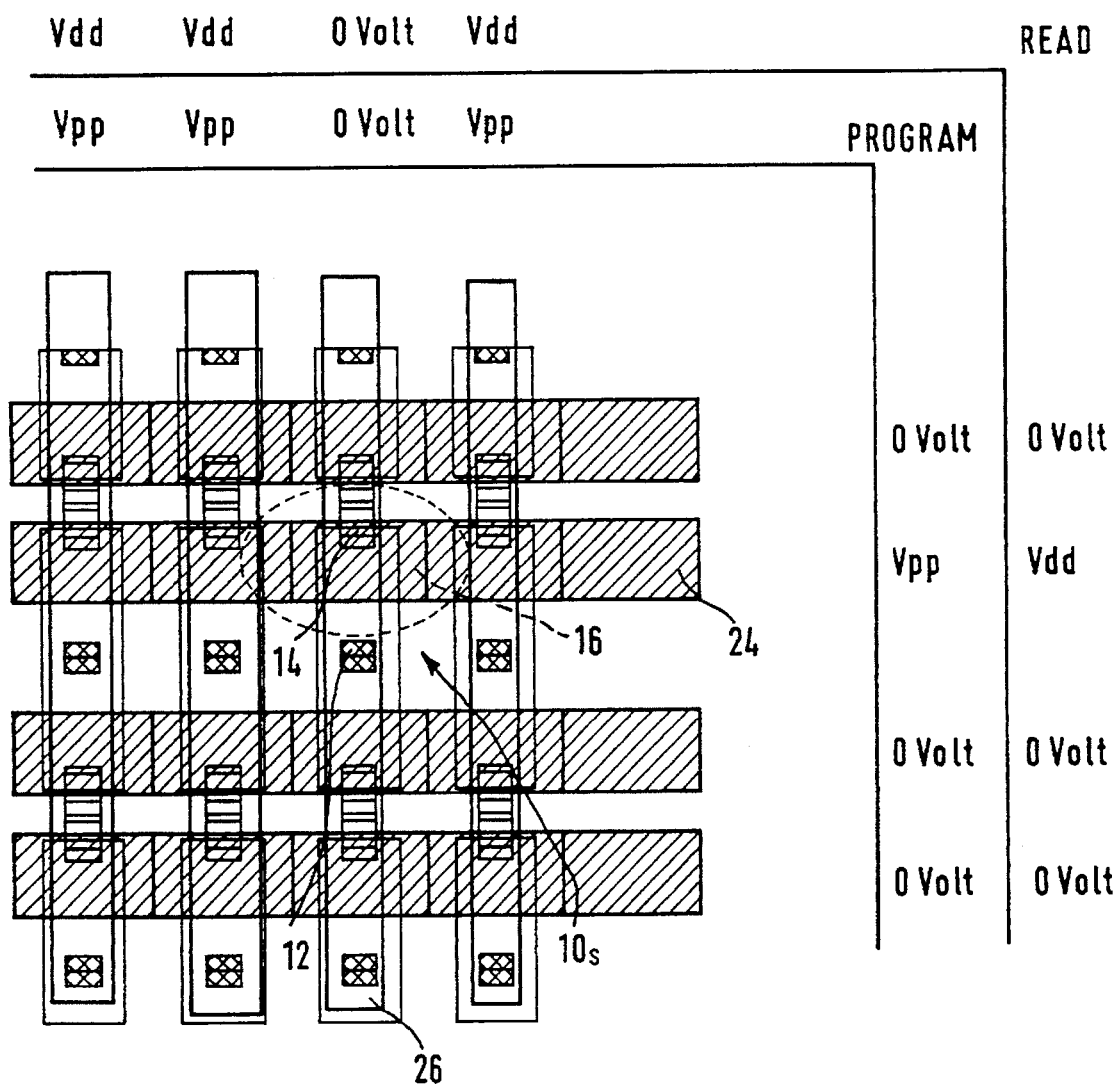
FIG. 3 shows a matrix array of memories programmable and readable according to the present invention.

FIG. 3 shows an integrated circuit (IC) comprising a 4×4 array of programmable semiconductor memories made in accordance with the present invention. In general, the memories of such an IC are arranged in the form of a matrix, with the programming voltage and a read voltage being applicable to the memories via rows and columns, respectively. Thus, each memory can be programmed by applying a read voltage. Furthermore, an opposing voltage preventing the programming may be applicable to the memories currently not to be programmed. This allows each memory to be programmed individually, without adjacent memories being simultaneously programmed via an interconnection.

More specifically, the voltage values for programming and reading a selected one of the transistors are shown in FIG. 3. The programming voltage and the read voltage are applied to rows and columns, respectively, via metal paths. To program a selected one of the transistors, a programming voltage Vpp is applied to the gate electrode 16 of a selected transistor $10_s$ via the electrode of a row 24. Via column 26, a voltage of 0 volts is applied to the drain region of the selected transistor 10 via the source region 12. On application of the programming voltage Vpp, the antifuse region of the transistor $10_s$ changes to its low-impedance state, so that a conductive path is provided between the drain region 14 and the gate electrode 16. By applying the 0 volts voltage to the drain region 14 of the transistor $10_s$ and the read voltage Vdd to the gate electrode 16 of the transistor $10_s$, a current through the transistor $10_s$ can be measured. This current can be remeasured via row 24 or via column 26. The programming voltages Vpp applied to the other transistors in the array prevent any of these surrounding transistors from being programmed during programming of the transistor $10_s$.

To read from the transistor $10_s$ via row 24, a voltage of 0 volts is applied to the gate electrodes of each of the surrounding transistors in the array and a read voltage Vdd is applied to the source regions of each of the transistors in the array so that only the flow of current through the selected transistor $10_s$ will be sensed. If a voltage of 0 volts is applied to the source region 12 of the transistor $10_s$, the transistor $10_s$ can be read via column 26. At the same time, the transistors located in the same row of the array can be read via the associated columns.

Figure 2:
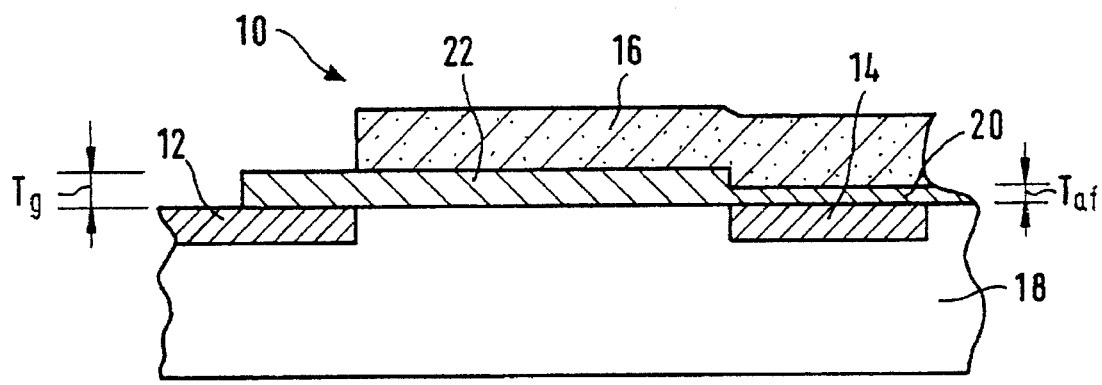
FIG. 2 is a cross-sectional view taken along line 2—2 of FIG. 1.

It should be understood that FIGS. 1 to 3 are only schematic representations of the present invention. As such, the electrode connections of the transistors and other details familiar to those skilled in the art have not been shown.

Further, the embodiment described herein is merely exemplary and thus, a person skilled in the art may make many variations and modifications to the embodiment utilizing functionally equivalent elements to those described herein. Any and all such variations or modifications as well as others which may become apparent to those skilled in the art, are intended to be included within the scope of the invention as defined by the appended claims.

What is claimed is:

1. A programmable metal oxide semiconductor field-effect transistor memory comprising:

a drain region;

a source region laterally spaced from said drain region;

a gate electrode disposed over said drain region; and an antifuse region disposed under said gate electrode and over said drain region, wherein said antifuse region is fabricated from a material exhibiting a first impedance state for electrically isolating said gate electrode from said drain region prior to an application of a programming voltage to said gate electrode, and exhibiting a second impedance state lower than said first impedance state upon the application of the programming voltage to said gate electrode which is greater than a supply voltage applied across said drain region and said source region.

2. The programmable metal oxide semiconductor field-effect transistor memory according to claim 1, wherein said antifuse region is fabricated from silicon dioxide.

3. The programmable metal oxide semiconductor field-effect transistor memory according to claim 1, wherein said antifuse region covers said drain region.

4. The programmable metal oxide semiconductor field-effect transistor memory according to claim 1, further comprising a gate oxide of a predetermined thickness disposed under said gate electrode, said antifuse region having a thickness which is less than said predetermined thickness of said gate oxide.

5. The programmable metal oxide semiconductor field-effect transistor memory according to claim 1, wherein said antifuse region has a thickness ranging between 8 and 12 nm.

6. The programmable metal oxide semiconductor field-effect transistor memory according to claim 1, wherein said drain region has a predetermined doping level, said antifuse region having a predetermined breakdown strength which is dependent upon said predetermined doping level of said drain region.

7. The programmable metal oxide semiconductor field-effect transistor memory according to claim 7, wherein said source region has a predetermined doping level, said doping level of said drain region being lower than said doping level of the source region.

8. The programmable metal oxide semiconductor field-effect transistor memory according to claim 7, wherein said doping level of said drain region is lower by a factor of 10 than said doping level of the source region.

9. An integrated circuit including a plurality of programmable metal oxide semiconductor field-effect transistor memories, each of said memories comprising:

a drain region;

a source region laterally spaced from said drain region;

a gate electrode disposed over said drain region; and an antifuse region disposed under said gate electrode and over said drain region, wherein said antifuse region is fabricated from a material exhibiting a first impedance state for electrically isolating said gate electrode from said drain region prior to an application of a programming voltage to said gate electrode, and exhibiting a second impedance state lower than said first impedance state upon the application of the programming voltage to said gate electrode which is greater than a supply voltage applied across said drain region and said source region.

10. The integrated circuit according to claim 9, wherein said memories are arranged as a matrix of rows and columns, said rows and columns enabling a programming voltage and a read voltage to be applied to said memories.

11. The integrated circuit according to claim 10, wherein an opposing voltage for preventing the programming of a memory can be applied to select ones of said memories which are not currently being programmed.

12. A programmable semiconductor memory comprising:

a drain region;

a source region spaced laterally from said drain region;

a gate electrode disposed over said drain region; and an antifuse region disposed under said gate electrode and over said drain region, wherein said antifuse region is fabricated from a material exhibiting a first impedance state for electrically isolating said gate electrode from said drain region prior to an application of a programming voltage to said gate electrode, and exhibiting a second impedance state lower than said first impedance state upon the application of the programming voltage to said gate electrode which is greater than a supply voltage applied across said drain region and said source region.

13. The programmable semiconductor memory according to claim 12, further comprising a gate oxide of a predetermined thickness disposed under said gate electrode, said antifuse region having a thickness which is less than said predetermined thickness of said gate oxide.

14. The programmable semiconductor memory according to claim 13, wherein said gate oxide is fabricated from said material of said antifuse region.

15. The programmable semiconductor memory according to claim 13, wherein said material comprises silicon dioxide.

16. The programmable semiconductor memory according to claim 12, wherein said antifuse region is fabricated from silicon dioxide.

17. The programmable semiconductor memory according to claim 12, wherein said antifuse region has a thickness ranging between 8 and 12 nm.

18. The programmable semiconductor memory according to claim 12, wherein said drain region has a predetermined doping level, said antifuse region having a predetermined breakdown strength which is dependent upon said predetermined doping level of said drain region.

19. The programmable metal oxide semiconductor field-effect transistor memory according to claim 18, wherein said source region has a predetermined doping level, said doping level of said drain region being lower than said doping level of the source region.

20. The programmable metal oxide semiconductor field-effect transistor memory according to claim 19, wherein said doping level of said drain region is lower by a factor of 10 than said doping level of the source region.

* * * * *